(12) United States Patent
Cai et al.

(10) Patent No.: US 10,229,740 B2
(45) Date of Patent: Mar. 12, 2019

(54) MEMORY SYSTEM OF 3D NAND FLASH AND OPERATING METHOD THEREOF

(71) Applicant: SK hynix Inc., Gyeonggi-do OT (KR)

(72) Inventors: Yu Cai, San Jose, CA (US); Haibo Li, Cupertino, CA (US); Fan Zhang, Fremont, CA (US); June Lee, Sunnyvale, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/783,780

(22) Filed: Oct. 13, 2017

(65) Prior Publication Data
US 2018/0108417 A1   Apr. 19, 2018

Related U.S. Application Data

(60) Provisional application No. 62/409,222, filed on Oct. 17, 2016.

(51) Int. Cl.
*G11C 16/10* (2006.01)
*G11C 16/04* (2006.01)
*G11C 16/26* (2006.01)
*G11C 16/34* (2006.01)

(52) U.S. Cl.
CPC .......... *G11C 16/10* (2013.01); *G11C 16/0483* (2013.01); *G11C 16/26* (2013.01); *G11C 16/3427* (2013.01)

(58) Field of Classification Search
CPC ................................ G11C 16/10; G11C 16/26
USPC ........................................ 365/185.11, 185.24
See application file for complete search history.

(56) References Cited

U.S. PATENT DOCUMENTS

| | | | | |
|---|---|---|---|---|
| 7,286,408 B1* | 10/2007 | Higashitani | ........ | G11C 16/3418 365/185.18 |
| 8,908,431 B2* | 12/2014 | Shim | ...................... | G11C 16/10 365/185.02 |
| 9,286,994 B1* | 3/2016 | Chen | ........................ | G11C 16/08 |
| 2008/0117684 A1* | 5/2008 | Hemink | ............... | G11C 11/5628 365/185.19 |
| 2008/0159004 A1* | 7/2008 | Hemink | ............... | G11C 11/5628 365/185.25 |
| 2011/0286276 A1* | 11/2011 | Lin | ..................... | G11C 16/0483 365/185.18 |
| 2011/0317489 A1* | 12/2011 | Kim | ................... | G11C 16/0483 365/185.18 |
| 2014/0211563 A1* | 7/2014 | Chang | ................. | G11C 16/3459 365/185.03 |
| 2014/0233316 A1* | 8/2014 | Shim | ....................... | G11C 16/10 365/185.17 |
| 2014/0241069 A1* | 8/2014 | Kwak | ..................... | G11C 16/26 365/185.22 |
| 2016/0035424 A1* | 2/2016 | Chang | .................... | G11C 16/10 365/185.17 |

(Continued)

*Primary Examiner* — Michael Tran
(74) *Attorney, Agent, or Firm* — IP & T Group LLP

(57) ABSTRACT

An apparatus of a memory system and an operating method thereof include: memory blocks, each of the memory blocks includes strings, each of the stings has flash cells and select gates thereon, wherein the select gates of each of the strings with a same index number in each of the memory blocks are connected with each other, in each of the memory blocks, the strings are divided into groups, each of the groups includes at least one string, and each of the groups has own read counts management thereof.

18 Claims, 14 Drawing Sheets

(56) References Cited

U.S. PATENT DOCUMENTS

| | | | |
|---|---|---|---|
| 2016/0042791 A1* | 2/2016 | Sakui | G11C 16/0483 365/185.05 |
| 2016/0118123 A1* | 4/2016 | Jung | G11C 16/10 365/185.11 |
| 2016/0148703 A1* | 5/2016 | Kim | G11C 16/26 365/185.11 |
| 2016/0180934 A1* | 6/2016 | Sakui | G11C 16/0483 365/185.11 |
| 2016/0314840 A1 | 10/2016 | Nam et al. | |

* cited by examiner

MEMORY SYSTEM OF 3D NAND FLASH AND OPERATING METHOD THEREOF

CROSS REFERENCE TO OTHER APPLICATIONS

This application claims priority to U.S. Provisional Patent Application No. 62/409,222 entitled CIRCUITS AND PROGRAM SCHEMES WITH MINIMIZED CROSS-STRING READ DISTURB IN 3D NAND FLASH MEMORY filed Oct. 17, 2016, which is incorporated herein by reference for all purposes.

BACKGROUND

Field of Invention

Exemplary embodiments of the present invention relate to an apparatus of semiconductor memory storage system, and more particularly to NAND performance enhancement and an operation method thereof.

Description of Related Arts

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices. Thus, the reliability and performance of digital data storage, such as a memory system, is critical.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD can include various flash memory components. The two main types of flash memory components are named after the NAND and NOR logic gates. The individual flash memory cells exhibit internal characteristics similar to those of the corresponding gates. The NAND-type flash memory may be written and read in blocks (or pages) which are generally much smaller than the entire device. The NAND-type operates primarily in memory cards, USB flash drives, solid-state drives, and similar products, for general storage and transfer of data.

High performance and reliability are always very important components of any storage solution. Error reduction of a disk is particularly crucial.

Thus, there remains a need for a semiconductor memory system having a reduced error and operating method thereof. In view of the ever-increasing need to improve performance and reliability, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a semiconductor memory system and an operating method thereof capable of improving the performance and reliability of a memory system.

In accordance with an embodiment of the present disclosure, there is provided with an n apparatus of a memory system which includes: memory blocks, each of the memory blocks includes strings, each of the stings has flash cells and select gates thereon, wherein the select gates of each of the strings with a same index number in each of the memory blocks are connected with each other, in each of the memory blocks, the strings are divided into groups, each of the groups includes at least one string, and each of the groups has own read counts management thereof.

In accordance with an embodiment of the present disclosure, there is provided with a method of operating a memory system which includes: arranging memory blocks, each of the memory blocks includes strings, each of the stings has flash cells and select gates thereon; connecting the select gates of each of the strings with a same index number in each of the memory blocks with each other; in each of the memory blocks, dividing the strings into groups, each of the groups includes at least one string; programming the flash cells; and performing read counts management for each of the groups.

DETAILED DESCRIPTION

Figure 1:
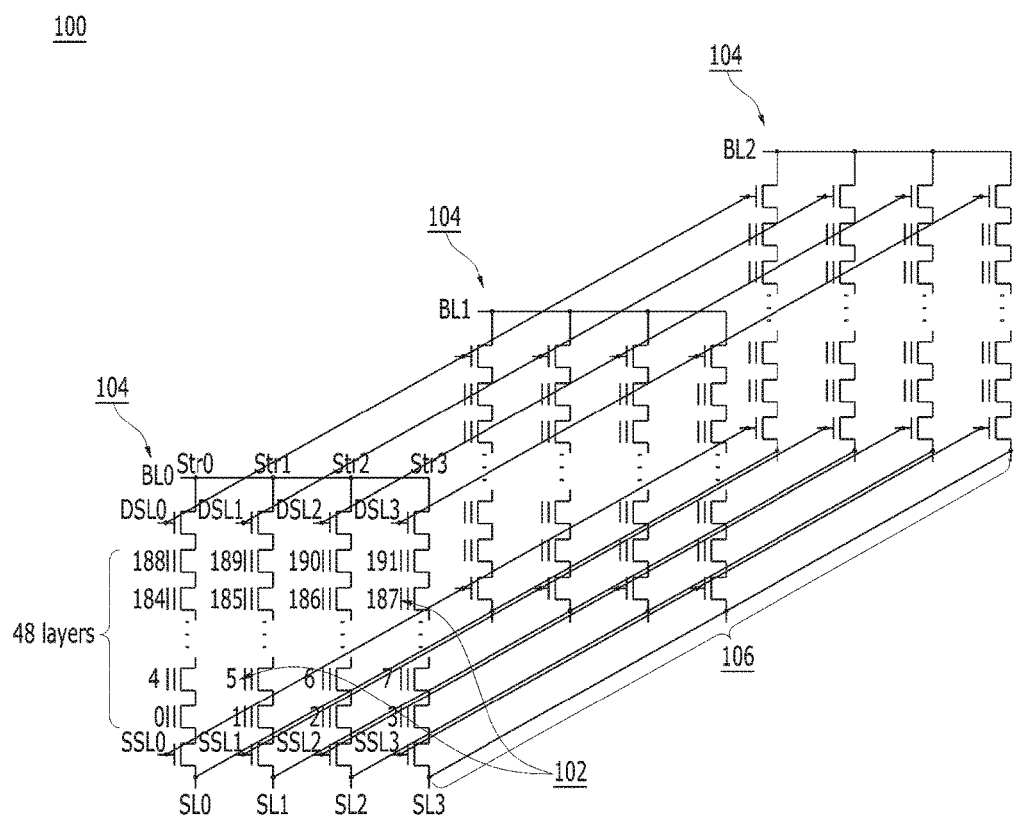
FIG. 1 is a diagram schematically illustrating a 3D semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Referring now to FIG. 1, herein is shown a diagram schematically illustrating a 3D semiconductor memory system in accordance with an embodiment of the present invention. In an example shown in FIG. 1, the 3D NAND flash memory system 100 can be a circuit structure comprising 48 layers and 4 strings, wherein the strings can be vertical chains of flash cells, and the layers can be horizontal groups of the flash cells.

The number of logical wordlines (WL) 102 of the 3D NAND flash memory system 100 can be 48×4, and arranged and indexed from 0 to 191. Each of the logical WLs may contain 1, 2 or 3 logical pages, corresponding to single-level cell (SLC), multi-level cell (MLC), and triple-level cell (TLC), respectively. In a straight vertical channel 3D NAND, the logical WLs in a same physical layer 104 may share a same control gate. In a U-shaped vertical channel 3D NAND, the physical WLs in the same physical layer 104 have the interdigitated structure. Such that, as shown in FIG. 1, logical WL0 and logical WL2 may share a same control gate, while logical WL1 and logical WL3 may share another control gate. Conventional program sequence for programming a block or a memory block can start from the logical WL0 and end at WL191 sequentially, as illustrated in FIG. 1.

During read operation, a set of read reference voltages can be applied to selected logical WLs. A pass voltage Vpass voltage can be applied to other unselected logical WLs. The Vpass voltage can be higher than the threshold voltage Vt of any flash cells on the unselected logical WLs, such that all the flash cells on the unselected logical WLs are turned on. However, the high Vpass voltage can cause a high electrical field between a floating gate and a substrate in a floating gate case, or within an oxide-nitride-oxide (ONO) layer of charge-trapping devices, to the flash cells on the unselected logical WLs. The high electrical field may cause the flash cells to be weakly programmed later, especially for the flash cells on erase state after being read for many times, resulting in a scenario of read disturb (RD). The threshold voltage Vt distribution at erase state can be shifted up as a right tail thereof.

Figure 2:
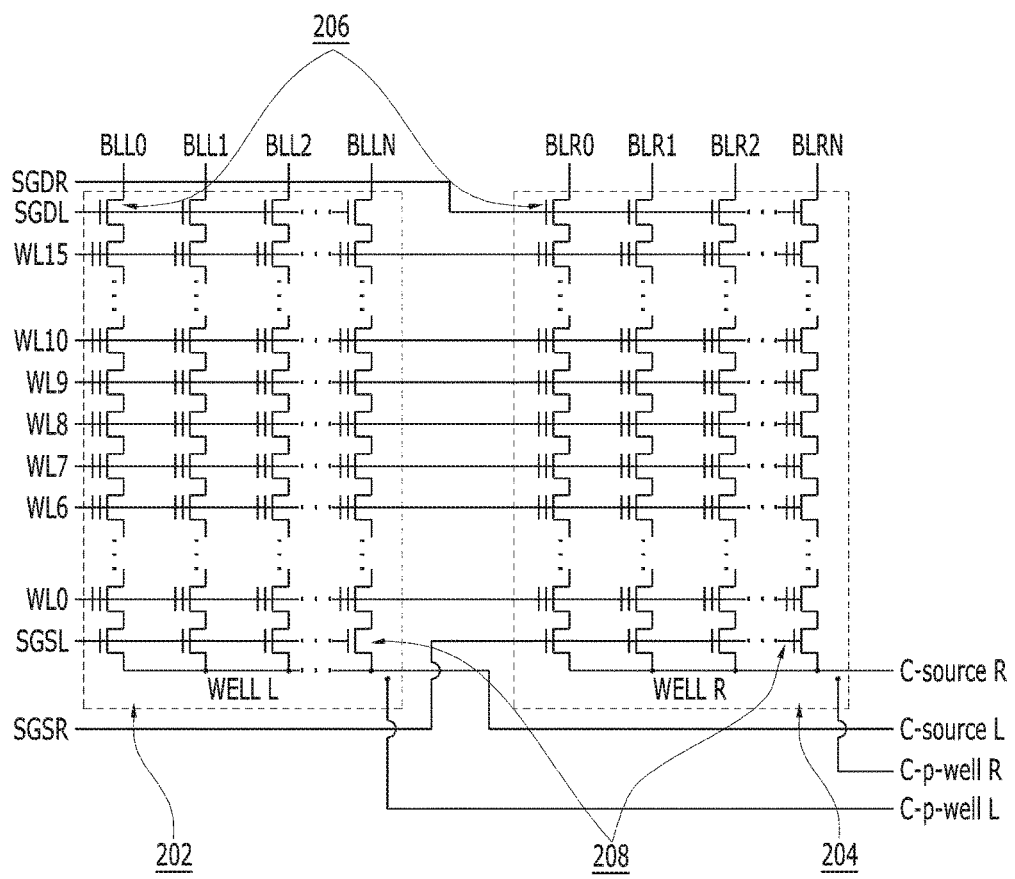
FIG. 2 is a diagram schematically illustrating boosted channels of a semiconductor memory system in accordance with an embodiment of the present invention.

Referring now to FIG. 2, herein is shown a diagram schematically illustrating boosted channels of a semiconductor memory system in accordance with an embodiment of the present invention. As shown in FIG. 2, the proposed circuit structure can use boosted channels during read operation to reduce the read disturb to the flash cells on the unselected logical WLs in a 2D NAND. In this embodiment of the present invention, a 2D NAND block can be divided into a left half block 202 and a right half block 204, and each half block can have own source-side select gates 208 and drain-side select gates 206 thereof. When a half page on the left half block 202 is read, both select gate drain left (SGDL) gates and select gate source left (SGSL) gates can be on, while both select gate drain right (SGDR) gates and select gate source right (SGSR) gates are off on a half page on the right half block 204, such that all channels on the right half block 204 can be boosted and the read disturb to the right half block 204 can be minimized. However, the proposed structure is hardly used in 2D NAND, because in reality all bitlines (BL) share the same source-side and drain-side select gates in the block in 2D NAND.

A direct comparison between 2D NAND and 3D NAND finds that, a vertical string slice 106 of the 3D NAND in FIG. 1 can be equivalent to an individual block of the 2D NAND in FIG. 2, when each string has own source-side and drain-side select gates thereof. Based on the comparison, the embodiments of the present invention provide new circuit structures and program schemes with minimized cross-string read disturb in 3D NAND flash memory and specific applications.

Figure 3:
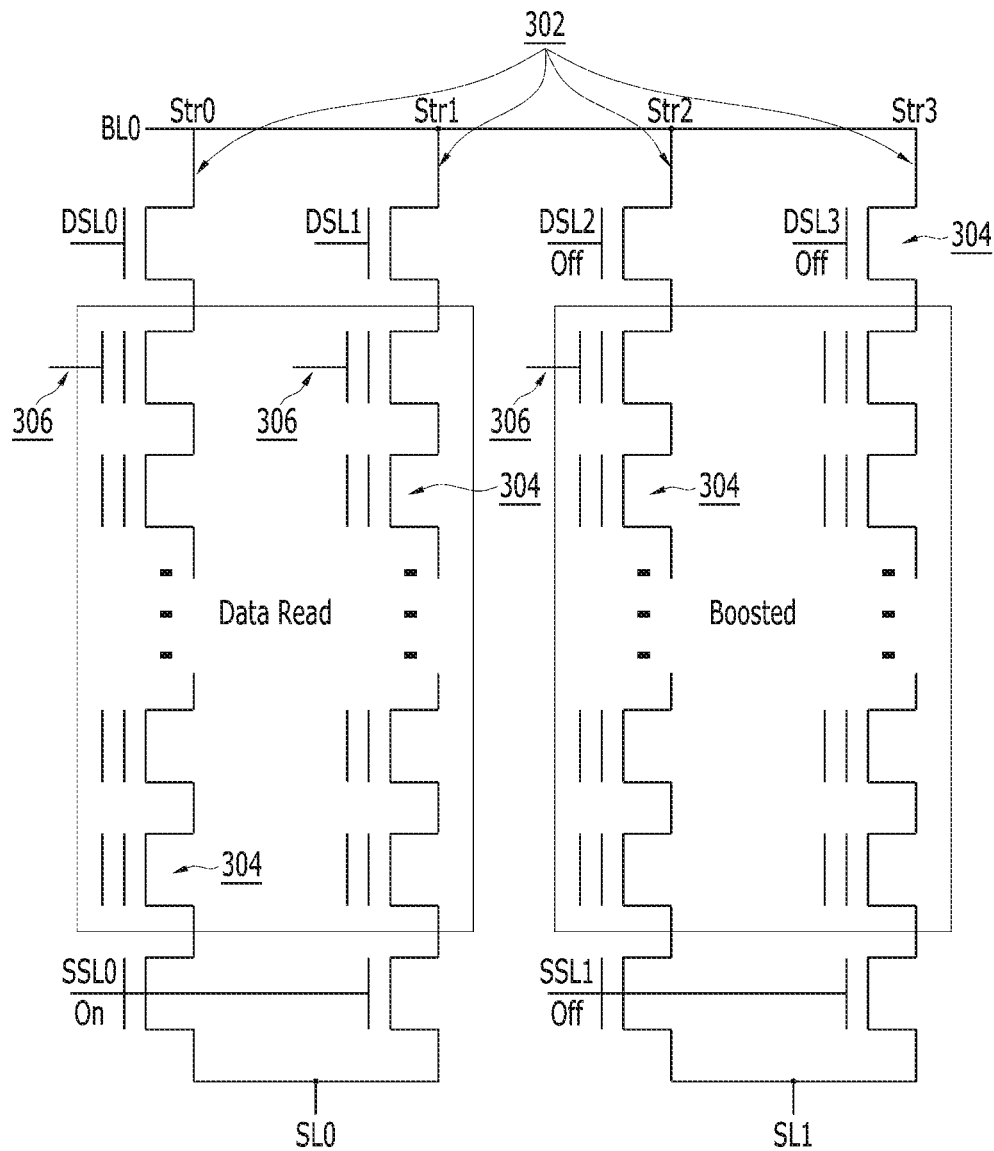
FIG. 3 is a diagram schematically illustrating boosted channels of a semiconductor memory system in accordance with an embodiment of the present invention.

Referring now to FIG. 3, herein is shown a diagram schematically illustrating boosted channels of a semiconductor memory system in accordance with an embodiment of the present invention. In FIG. 3, a physical layer 104 of FIG. 1 comprising 4 strings is shown. In this example, a 3D NAND flash memory has four strings 302, each of the four strings 302 has a plurality of flash cells 304 vertically chained with each other. A str0 and str1 can form a group sharing a same SSL0, while a str2 and str3 can form another group sharing a same SSL1. When one of the logical WLs 306 in the str0 or str1 is being read, the str2 and str3 may not suffer read disturb since the SSL0 and SSL1 are separated and the str2 and str3 may be boosted. When the flash cells 304 of the str0 or str1 are read, both DSL and SSL of the str2 and str3 are off, causing channels of the str2 and str3 in floating state, such as neither connecting to ground nor first bias voltage Vb1. Even when a high Vpass voltage is applied to the WLs 306 of the flash cells 304 in str2 and str3, the coupling capacitance between the gate and channel may cause channel voltages of the str2 and str3 to increase quickly, such that the channels are boosted. In this scenario, the str2 and str3 may not be disturbed by the read operations on the str0 and str1.

Figure 4:
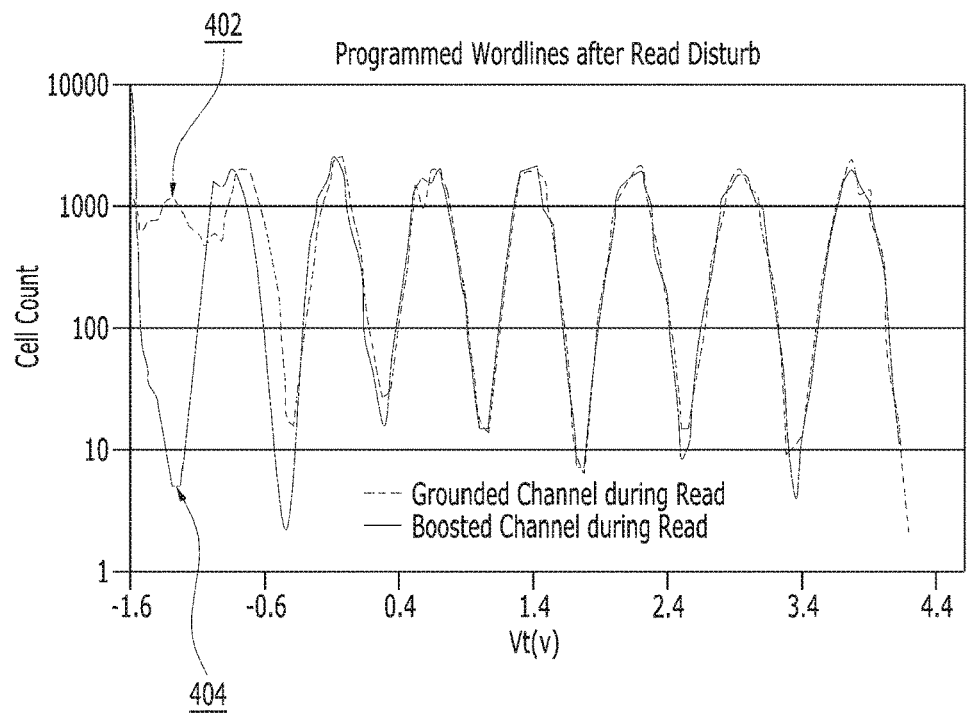
FIG. 4 is a diagram illustrating read disturb comparison of boosted channels and grounded channels of a semiconductor memory system in accordance with an embodiment of the present invention.

Referring now to FIG. 4, herein is shown a diagram illustrating read disturb comparison of boosted channels and grounded channels of a semiconductor memory system in accordance with an embodiment of the present invention. The experimental results shown in FIG. 4, such that the whole block programmed with random data and a selected page on the str0 and str1 is repeatedly read. By comparing programmed logical WLs on str0 and str1, and on str2 and str3, the flash cells on the str0 and str1, whose channels are grounded, may suffer severe read disturb. However, the read disturbs of the flash cells on the str2 and str3, whose channels are boosted, may be minimal.

As shown in FIG. 4, plots of read disturb with grounded channels and boosted channels are shown. A plot 402 illustrates the number of flash cells with grounded channels suffering read disturb, while a plot of 404 illustrates the number of flash cells with boosted channels having read disturb. The plot 402 representing grounded channel read disturb typically is higher than the plot 404 representing boosted channel read disturb, across a range of threshold voltages, especially when the threshold voltages are lower, for programmed wordlines after read disturbs.

Figure 5:
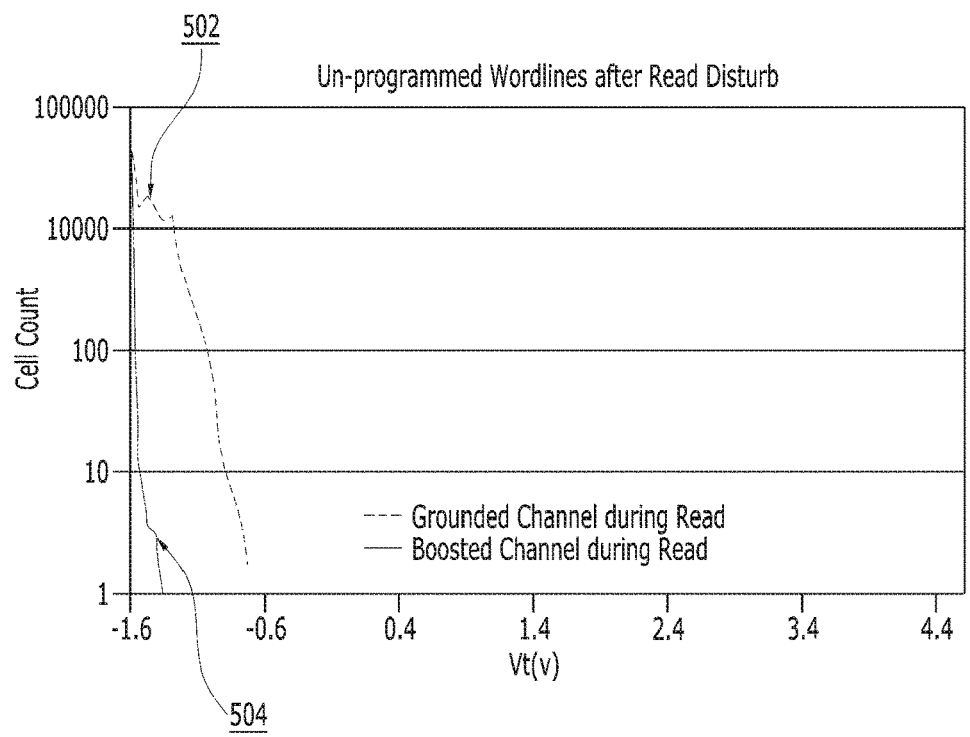
FIG. 5 is a diagram illustrating read disturb comparison of boosted channels and grounded channels of a semiconductor memory system in accordance with an embodiment of the present invention.

Referring now to FIG. 5, herein is shown a diagram illustrating read disturb comparison of boosted channels and grounded channels of a semiconductor memory system in accordance with an embodiment of the present invention. The experimental results shown in FIG. 5, such that the block partially programmed with random data and a selected page in str0 or str1 is repeatedly read. By comparing the un-programmed logical WLs on str0 and str1, and on str2 and str3, the erased flash cells on str0 and str1 may suffer severe read disturb with very high right tail in the threshold Vt distribution. However, the read disturb to the erased flash cells in str2 and str3 may be minimal.

As shown in FIG. 5, plots of read disturb with grounded channels and boosted channels are shown. A plot 502 illustrates the number of flash cells with grounded channels suffering read disturb, while a plot of 504 illustrates the number of flash cells with boosted channels having read disturb. The plot 502 representing grounded channel read disturb typically is higher than the plot 504 representing boosted channel read disturb across a range of threshold voltages, especially when the threshold voltages are lower, for un-programmed wordlines after read disturbs.

It has been discovered that the read disturbs with the boosted channel is significantly improved than the read disturbs with the grounded channels, for programmed and un-programmed wordlines.

Figure 6A:
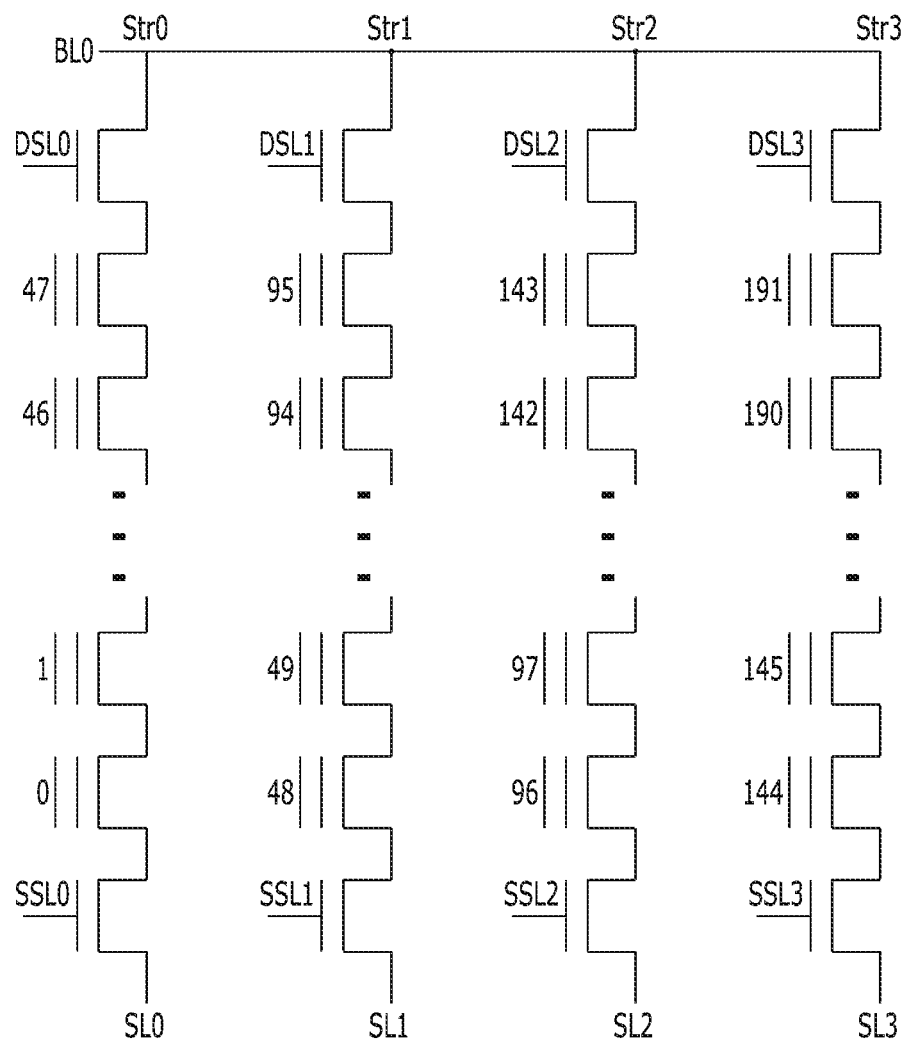
FIG. 6A is a diagram schematically illustrating circuits and program schemes of a semiconductor memory system in accordance with an embodiment of the present invention.

Referring now to FIG. 6A, herein is shown a diagram schematically illustrating circuits and program schemes of a semiconductor memory system in accordance with an embodiment of the present invention. The circuit schematic in FIG. 6A structures a 3D NAND, for example, a 48-layer and 4-string 3D NAND as shown in FIG. 1. In FIG. 6A, each string of the 4 strings can have own source-side select gates thereof, such as SSL0, SSL1, SSL2, and SSL3, and drain-side select gates thereof, such as DSL0, DSL1, DSL2, and DSL3. Each of the source-side select gates can have own source thereof, such as SL0, SL1, SL2, and SL3.

In the embodiment of the present invention, each of the 4 strings may not share the source-side select gates or sources with each other. The scheme for programming the circuit structure in FIG. 6A may start vertically from a logical WL0 at the source-side layer on the first string str0, and end at a logical WL191 at the drain-side layer on the last string str3 sequentially, as marked in FIG. 6A. The SSL0, SSL1, SSL2, and SSL3 may be programmed with different values, such that the flash cells of each string may have the grounded channels or boosted channels.

Figure 6B:
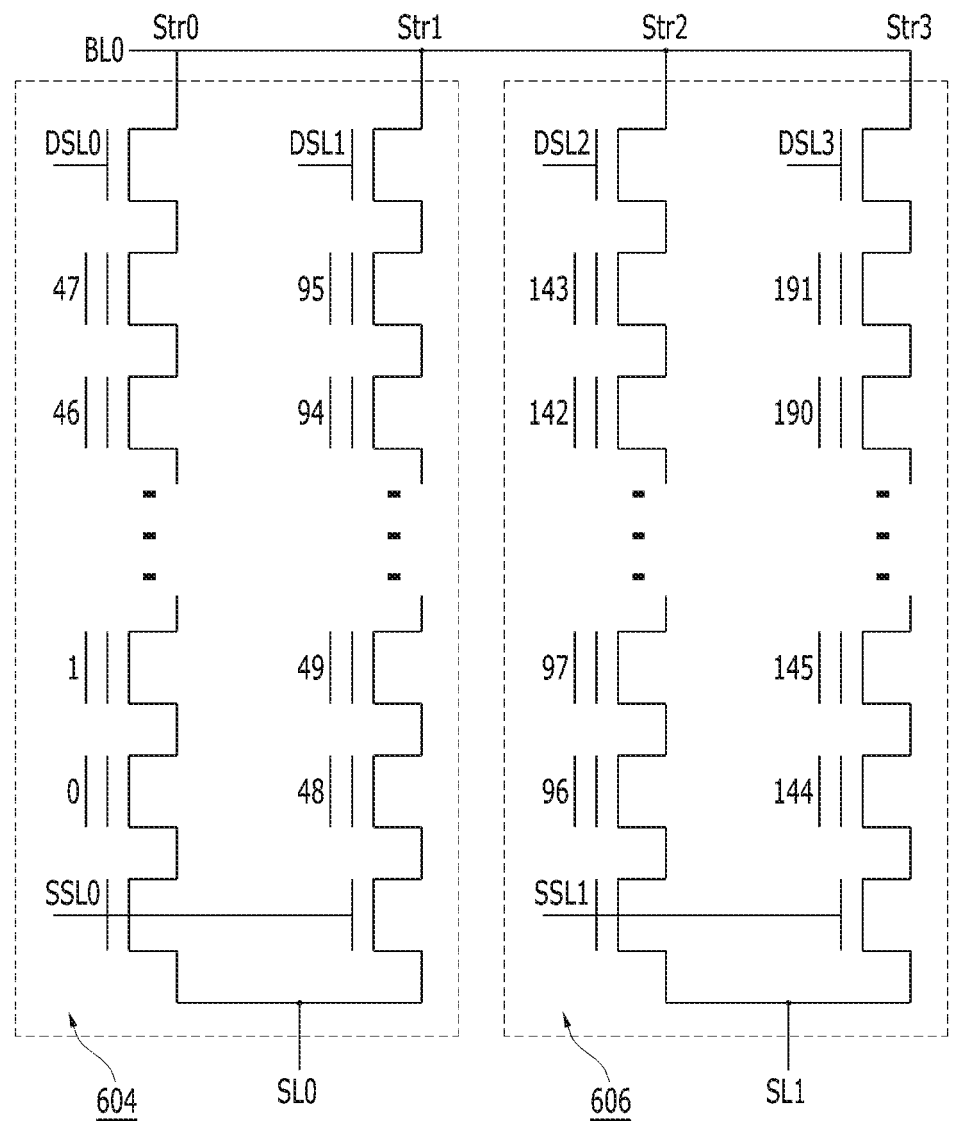
FIG. 6B is a diagram schematically illustrating circuits and program schemes of a semiconductor memory system in accordance with an embodiment of the present invention.

Referring now to FIG. 6B, herein is shown a diagram schematically illustrating circuits and program schemes of a semiconductor memory system in accordance with an embodiment of the present invention. The circuit schematic in FIG. 6B structures a 3D NAND, for example, a 48-layer and 4-string 3D NAND as shown in FIG. 1. In FIG. 6B, the circuit structure can divide the strings into different groups, such as two groups including a left group 604 and a right group 606. Each of the strings may have own drain-side select gate thereof, such as DSL0, DSL1, DSL2, and DSL3. However, the source-side select gates in each group may be driven by same source-side select gate values, respectively, such as SSL0 in the left group 604 and SSL1 in the right group 606, as shown in FIG. 6B.

In the embodiment of the present invention, the scheme for programming the circuit structure in FIG. 6B may start vertically from a logical WL0 at the source-side layer on the first string str0 and end at a logical WL191 at the drain-side layer on the last string str3 sequentially, as marked in FIG. 6B. The SSL0 in the left group 604 and SSL1 in the right group 606 may be programmed with different values, such that the flash cells of the left group 604 may have grounded channels and the flash cells of the right group 606 may have boosted channels.

Figure 6C:
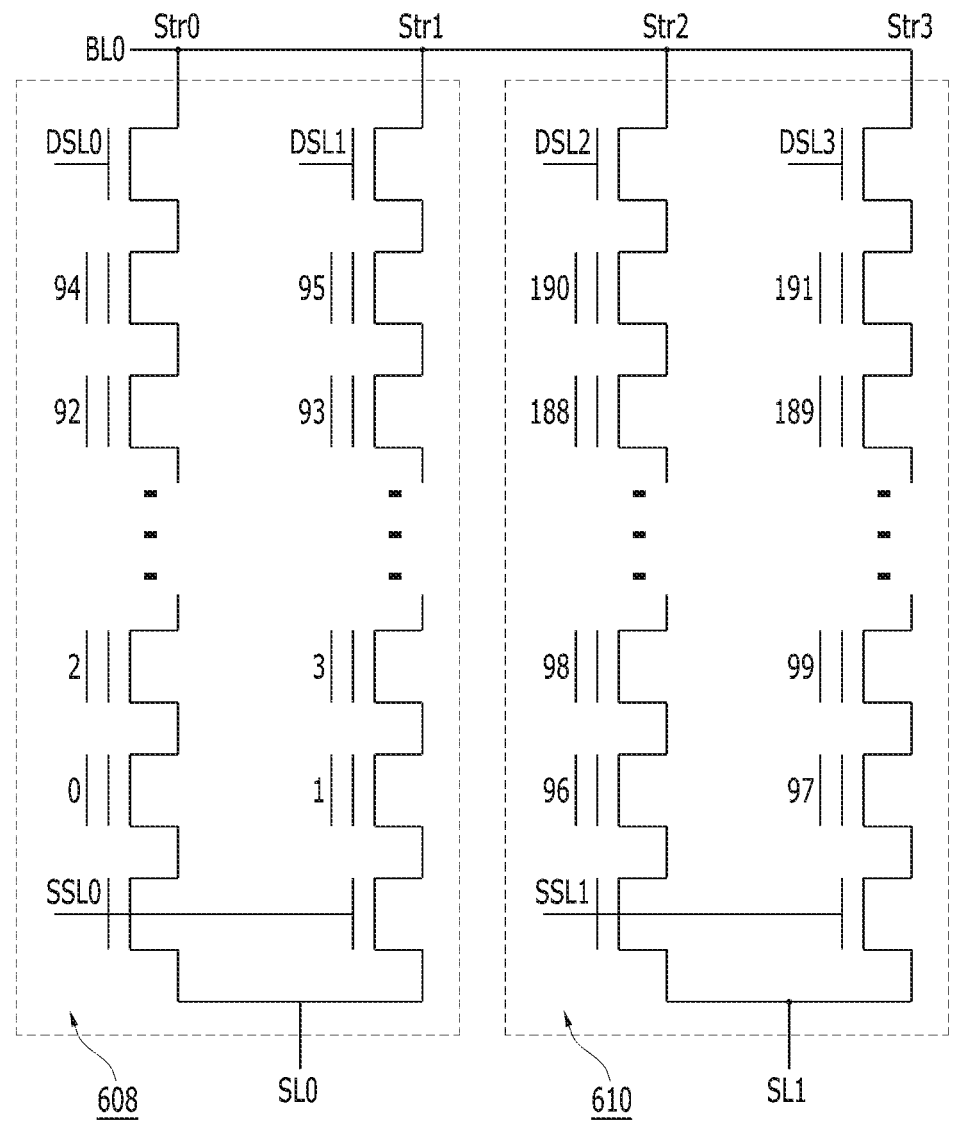
FIG. 6C is a diagram schematically illustrating circuits and program schemes of a semiconductor memory system in accordance with an embodiment of the present invention.

Referring now to FIG. 6C, herein is shown a diagram schematically illustrating circuits and program schemes of a semiconductor memory system in accordance with an embodiment of the present invention. The circuit schematic in FIG. 6C structures a 3D NAND, for example, a 48-layer and 4-string 3D NAND as shown in FIG. 1. The embodiment of the present invention shown in FIG. 6C, the circuit structure can divide the strings into different groups, such as two groups including a left group 608 and a right group 610. Each of the two strings in each group may have own drain-side select gate thereof, such as DSL0 and DSL1 in the left group 608, and DSL2 and DSL3 of the right group 610. However, each of the two strings in each group may share a same source-side select gate, such as SSL0 in the left group 608 and SSL1 in the right group 610, as shown in FIG. 6C.

In the embodiment of the present invention, the scheme for programming the circuit structure in FIG. 6C may start horizontally from a logical WL0 at the source-side layer on the first string str0 across each string in the same group, and end at a logical WL191 at the drain-side layer on the last string str3 sequentially, as marked in FIG. 6C. The SSL0 in the left group 608 and SSL1 in the right group 610 may be programmed with different values, such that the flash cells of the left group 608 may have grounded channels and the flash cells of the right group 610 may have boosted channels.

Figure 7:
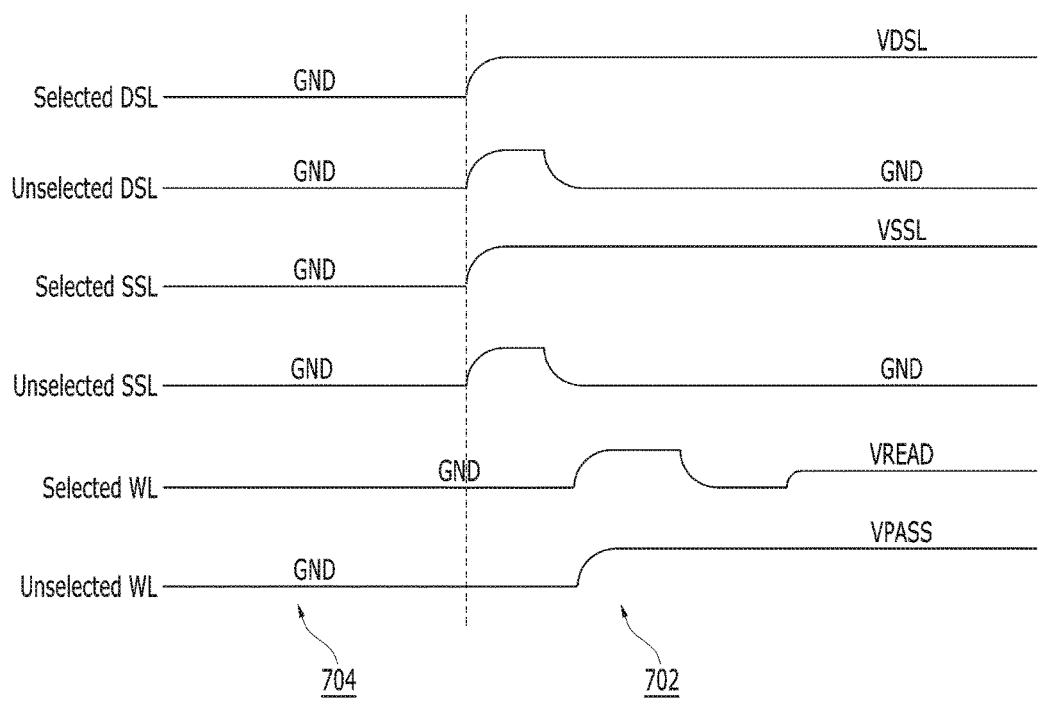
FIG. 7 is a diagram illustrating read operation timing and bias voltages of a semiconductor memory system in accordance with an embodiment of the present invention.

Referring now to FIG. 7, herein is shown a diagram illustrating read operation timing and bias voltages of a semiconductor memory system in accordance with an embodiment of the present invention. The timing diagram includes a non-read operation section 704 and a read operation section 702. All bias voltages in the non-read operation section 704 may be grounded for selected logical WLs and un-selected logical WLs since no read operation is performed.

The timing and bias voltages of the read operation section 702 for major elements are shown in FIG. 7. During the read operation, both source-side and drain-side select gates of the unselected logical WLs, such as unselected DSL and unselected SSL, can be grounded, while the unselected WLs are connected with a Vpass, such that the channels corresponding to the unselected logical WLs are boosted, resulting in little read disturb to the flash cells thereon. The bias voltages of the selected logical WLs, such as selected DSL and selected SSL can be driven with appropriate voltages for conducting the read operation, as shown in FIG. 7.

It has been discovered that the proposed circuits and program schemes can be particularly useful for partial block programming and read intensive applications, because only the programmed strings or logical WLs may suffer the read disturb and the un-programmed strings/logical WLs may be RD-immune.

Figure 8A:
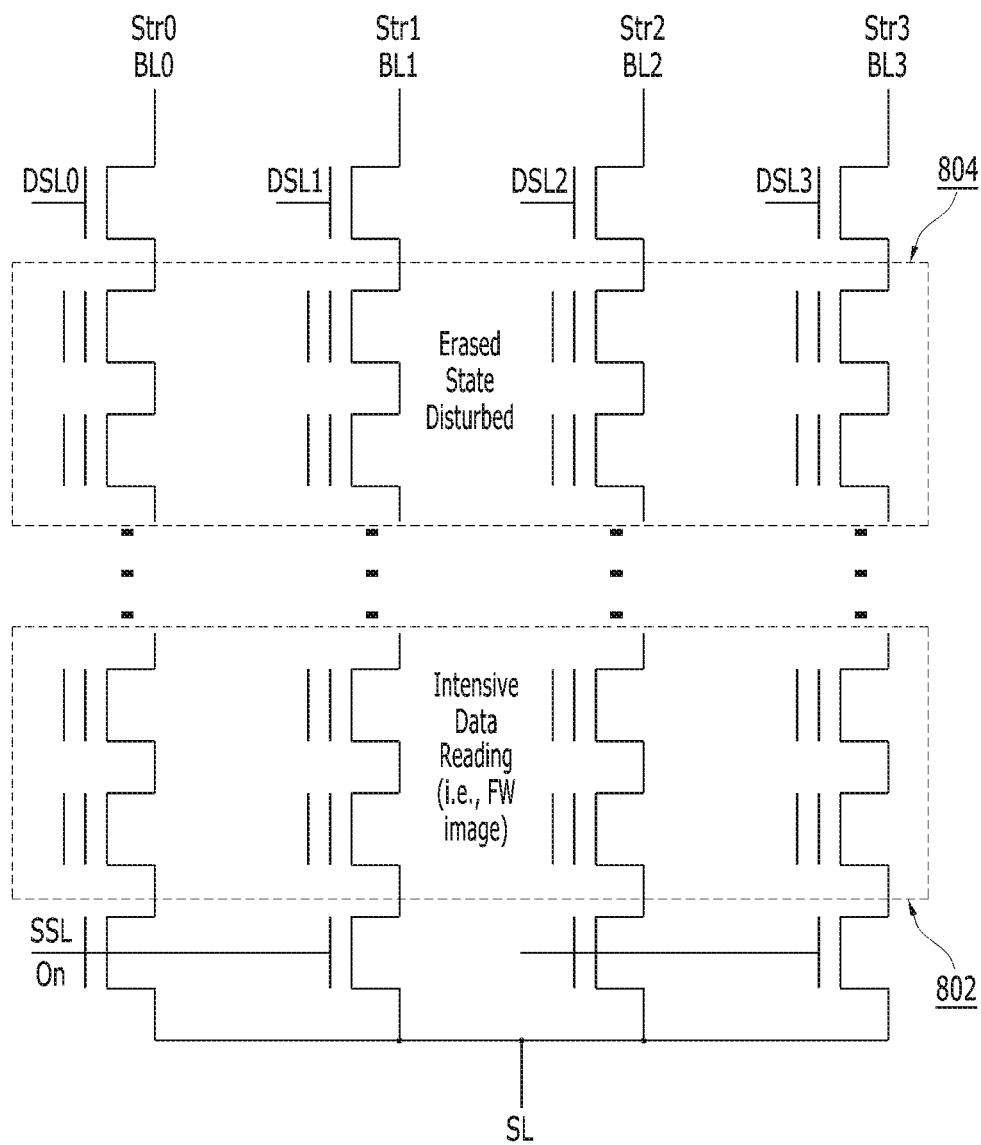
FIGS. 8A and 8B are diagrams schematically illustrating a partially programmed block of a semiconductor memory system in accordance with an embodiment of the present invention.
Figure 8B:
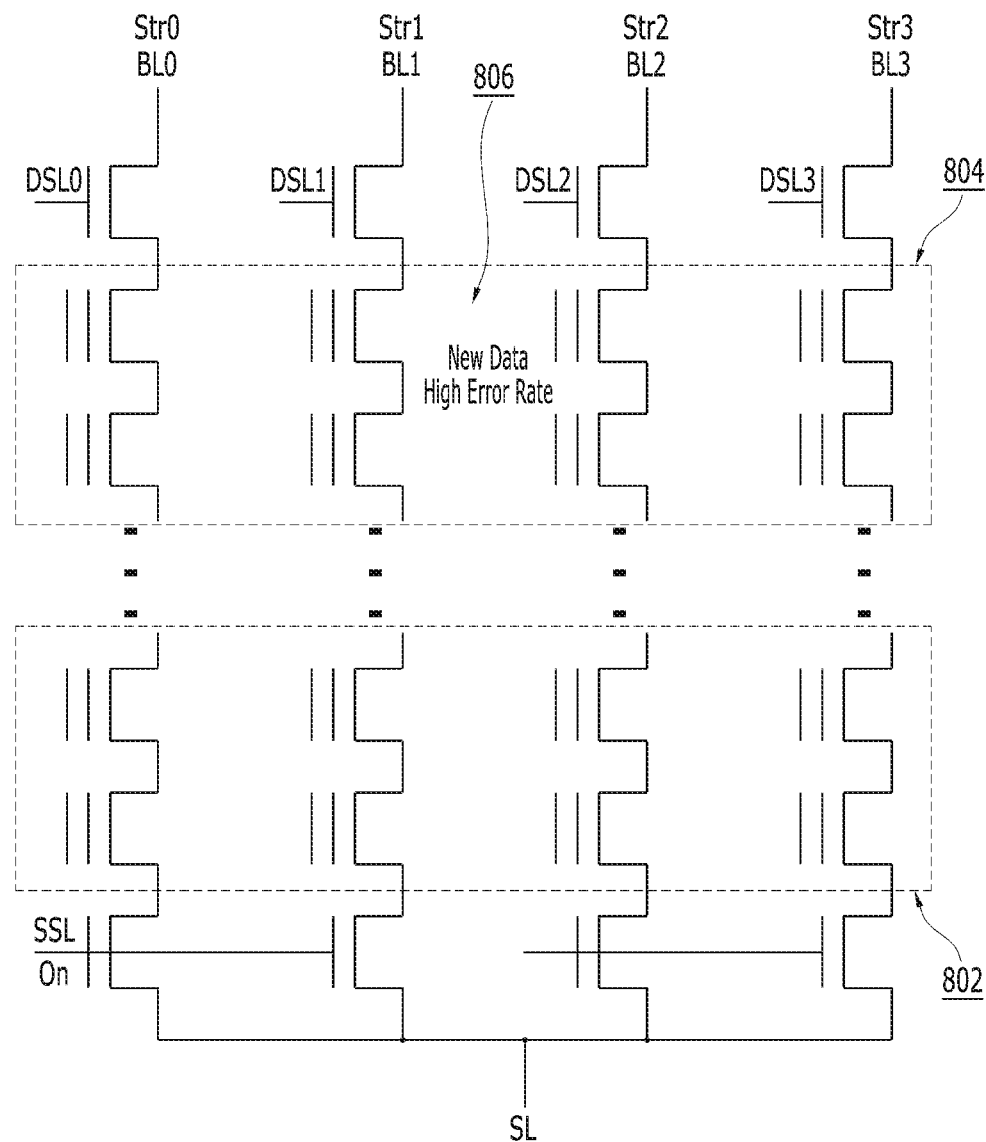

Referring now to FIGS. 8A and 8B, herein are shown diagrams schematically illustrating a partially programmed block of a semiconductor memory system in accordance with an embodiment of the present invention. In the FIGS. 8A and 8B, the source-side select gates of all strings of str0 to str3 may be driven by a same SSL and SL. The block can be divided into an intensive data reading section 802 and erased state disturbed section 804. The intensive data reading section 802 can be the section of the block where the read operation is performed actively, and the corresponding logical WLs are selected and programmed. The erased state disturbed section 804 can be the section of the block where no read operation is performed and the corresponding logical WLs are un-selected and un-programmed.

For example, a firmware image is typically less than 1 MB and one block of NAND is typically larger than 1 MB, such as 5 MB or larger. If the data with the size of 1 MB is programmed across all the strings with the shared source-side select gate SSL in the block, the repeatedly reading of the data in the intensive data reading section 802 can cause the erased cells on the un-programmed WLs in the erased state disturbed section 804 to increase threshold voltages as shown in FIG. 5. Typically, such data is not frequently updated and the block may be kept open for a long time, while the previously programmed data may be read for many times.

Later, as shown in FIG. 8B, when new data 806 may be programmed into the un-programmed logical WLs in the erased state disturbed section 804, the new data 806 may suffer large amount of errors, such as the read disturb, and may be unreliable. The read disturb of partially programmed open block is illustrated in FIGS. 8A and 8B. As the remedy method, the whole block may need to be erased before programming new data to it.

Figure 9A:
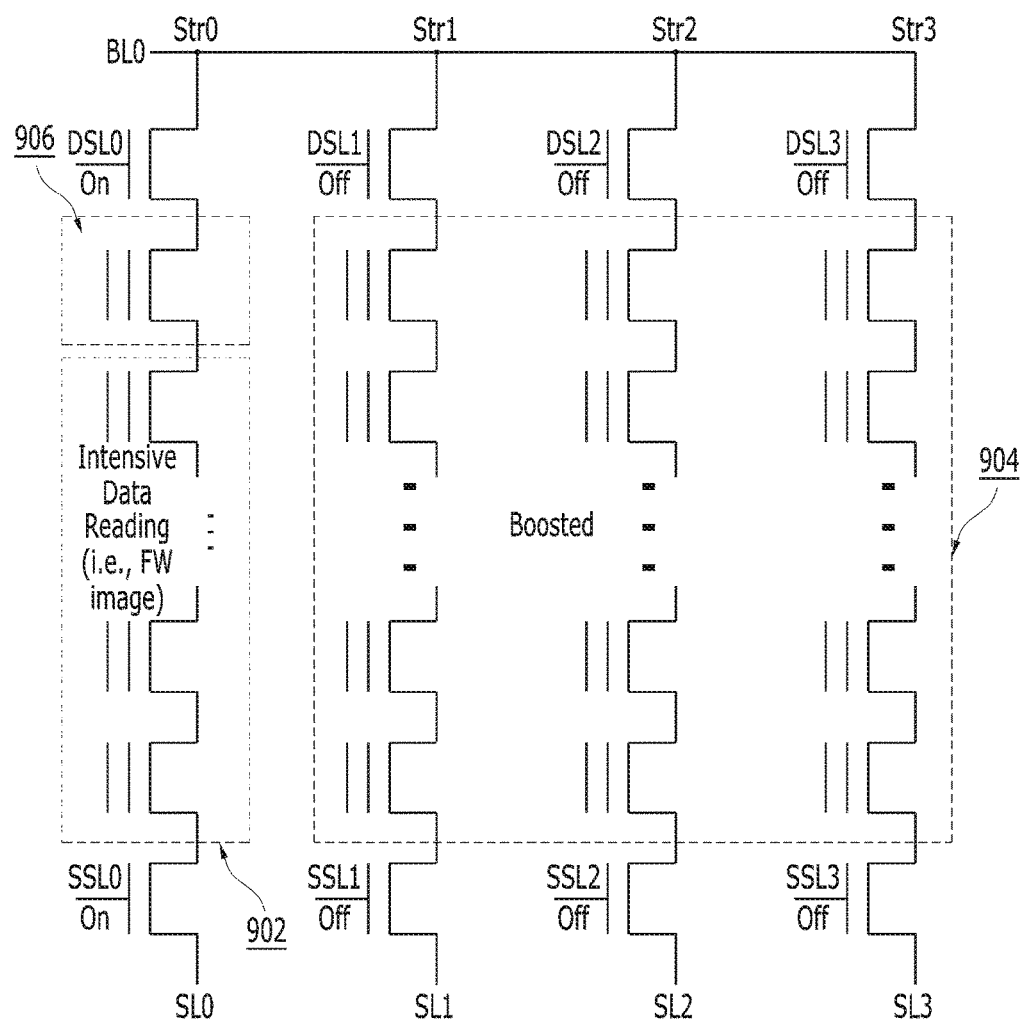
FIG. 9A is a diagram schematically illustrating a partially programmed block of a semiconductor memory system in accordance with an embodiment of the present invention.

Referring now to FIG. 9A, herein is shown a diagram schematically illustrating a partially programmed block of a semiconductor memory system in accordance with an embodiment of the present invention. In FIG. 9A, a partially programmed block having a circuits structure of FIG. 6A may be divided in to sections, such as an intensive data reading section 902, a boosted section 904, and a disturbed section 906. The source-side select gate of each string may have own SSL and SL thereof. The flash cells can be programmed sequentially on each string, from str0 to str3 as shown in FIG. 6A. The source-side and drain-side select gates on the string str0 are turned on, while the source-side and drain-side select gates on the strings of str1 to str3 in the boosted section 904 are turned off. In this embodiment, each string can be considered as a group, since each string has own SSL and SL.

In the embodiment of the present invention, with the proposed circuits structure and program schemes, the data in the intensive data reading section 902 can only be programmed to a string following the programming sequence as shown in FIG. 9A. After many times of data read in the string str0, the other strings in the boosted section 904 may not suffer read disturbs, since the source-side and drain-side select gates in the boosted section 904 are turned off. The updated data can be programmed to the other strings with high reliability, such as the strings in the boosted section 904. The disturbed section 906 may not be used for programming the updated data or new data to prevent errors caused by the read disturb. The whole block may not need to be erased before programming new data, even after severe read disturb to the old data string, such as disturbed section 906 of str0. In this apparatus and method, the lifetime of the block would be prolonged.

Since the read disturb only affects the data in the same string or string group, read counts may not need to be recorded in the block level. Instead, the read counts can be recorded by individual string or group. For each string or string group, the number of read hits thereto can be recorded. If the total number of read hits to the string or sting group is larger than a pre-determined threshold, only the data in that string or string group need to be corrected and relocated to other locations. The data in the other strings or string groups in the same block may be unchanged as their read disturb is negligible. For example, each string of str0 to str3 may have own read counts thereof to be recorded, such that 4 read counts need to be recorded. If the number of read hits of str0 is greater than the predetermined threshold, only the data in str0 need to be corrected and relocated to other locations. The data in the other strings in the same block may be unchanged as the read disturb thereof is negligible.

Figure 9B:
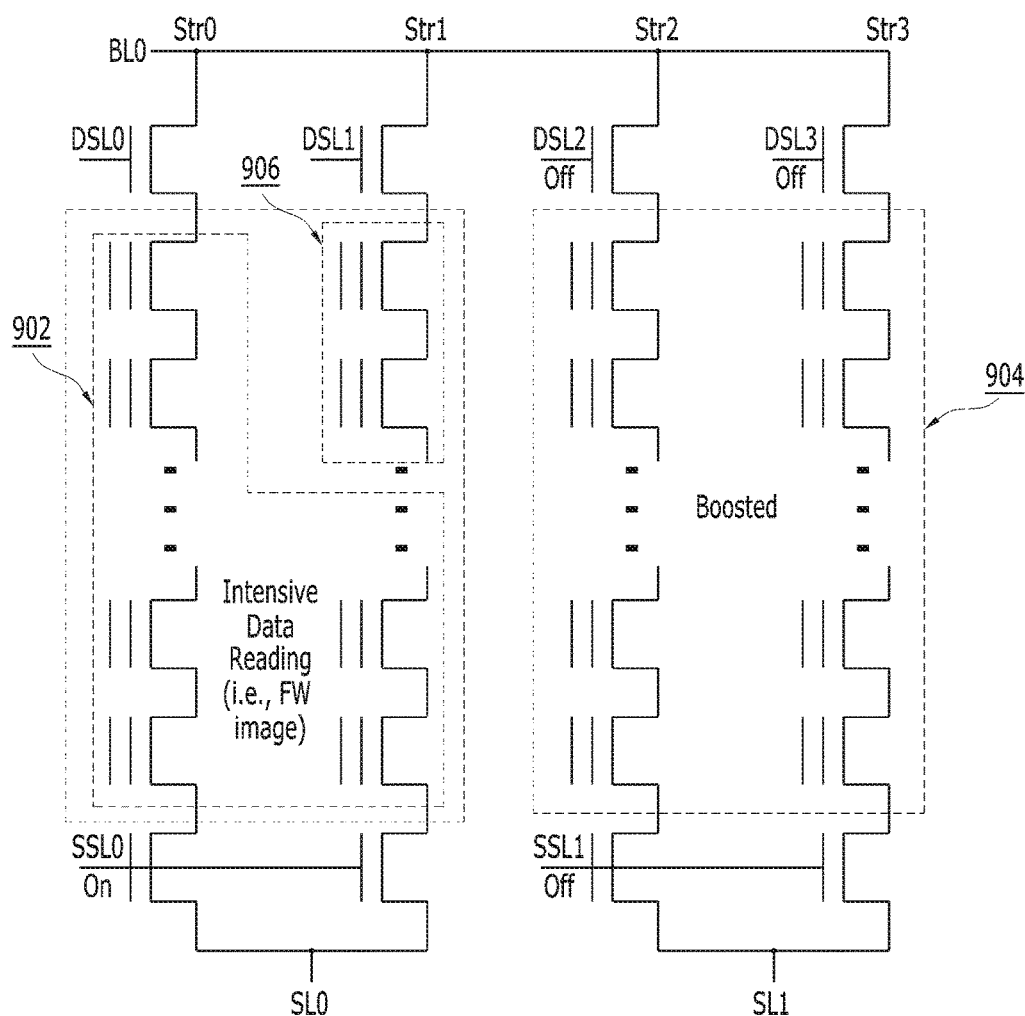
FIG. 9B is a diagram schematically illustrating a partially programmed block of a semiconductor memory system in accordance with an embodiment of the present invention.

Referring now to FIG. 9B, herein is shown a diagram schematically illustrating a partially programmed block of a semiconductor memory system in accordance with an embodiment of the present invention. In FIG. 9B, a partially programmed block having a circuits structure of FIG. 6B may be divided in to sections, such as an intensive data reading section 902, a boosted section 904, and a disturbed section 906. The source-side select gates may be divided into various groups, such as a left group of str0 and str1 and a right group of str2 and str3. Each group may have own SSL and SL shared by the strings thereof, such that the str0 and str1 sharing SSL0 and the str2 and str3 sharing SSL1. The flash cells can be programmed sequentially on each string, from str0 to str3 as shown in FIG. 6B. A subsequent string may be programmed upon the completion of the current string, such that the str1 may be programmed upon the completion of the str0. The source-side and drain-side select gates on the strings of str0 and str1 in the left group are turned on, while the source-side and drain-side select gates on the strings of str2 and str3 of the right group in the boosted section 904 are turned off.

In the embodiment of the present invention, with the proposed circuits structure and program schemes, the data in the intensive data reading section 902 can only be programmed to strings following the programming sequence as shown in FIG. 6B. After many times of data read in the strings of str0 and str1 in the intensive data reading section 902, the other strings of str2 and str3 in the boosted section 904 may not suffer read disturbs, since the source-side and drain-side select gates in the boosted section 904 are turned off. The updated data can be programmed to the other strings with high reliability, such as the strings of str2 and str3 in the boosted section 904. The disturbed section 906 may not be used for programming the updated data or new data to prevent errors caused by the read disturb. The whole block may not need to be erased before programming new data, even after severe read disturb to the old data string, such as str0 and str1. In this method, the lifetime of the block would be prolonged.

Since the read disturb only affects the data in the same string or string group, read counts may not need to be recorded in the block level. Instead, the read counts can be recorded by individual string or string group. For each string or string group, the number of read hits thereto can be recorded. If the total number of read hits to the string or sting group is larger than a pre-determined threshold, only the data in that string or string group need to be corrected and relocated to other locations. The data in the other strings or string groups in the same block may be unchanged as their read disturb is negligible. For example, each string of str0 to str3 may have own read counts thereof to be recorded, such that 4 read counts need to be recorded. When the number of read hits of str0 is greater than the predetermined threshold, the number of read hits of str1 may be less than the predetermined threshold. Thus, only the data in str0 need to be corrected and relocated to other locations, but the data in str1 may not need to be corrected and relocated. The data in the other strings in the same block may be unchanged as the read disturb thereof is negligible.

Figure 9C:
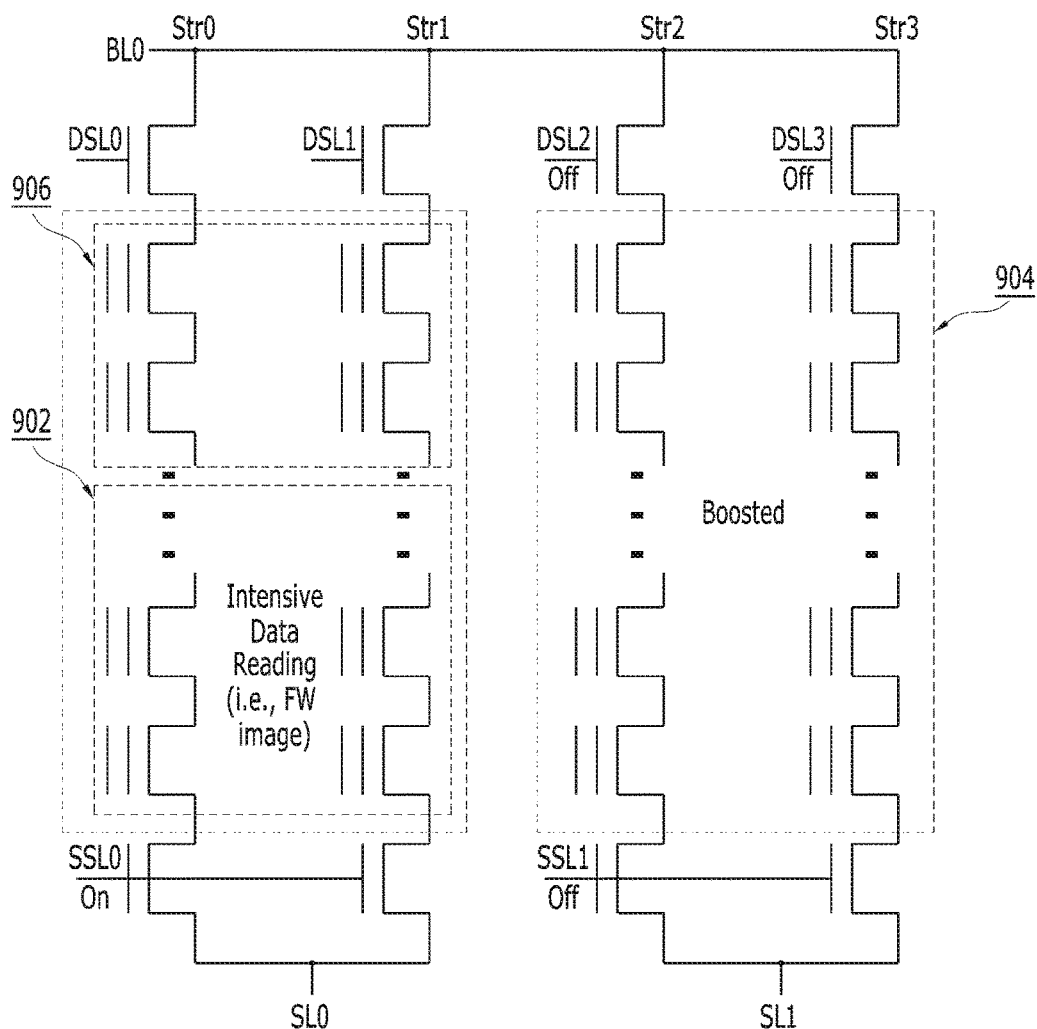
FIG. 9C is a diagram schematically illustrating a partially programmed block of a semiconductor memory system in accordance with an embodiment of the present invention

Referring now to FIG. 9C, herein is shown a diagram schematically illustrating a partially programmed block of a semiconductor memory system in accordance with an embodiment of the present invention. In FIG. 9C, a partially programmed block having a circuits structure of FIG. 6C may be divided in to sections, such as an intensive data reading section 902, a boosted section 904, and a disturbed section 906. The source-side select gates may be grouped into various groups, such as a left group of str0 and str1 and a right group of str2 and str3. Each group may have own SSL and SL shared by the strings thereof, such that the str0 and str1 sharing SSL0 and the str2 and str3 sharing SSL1. The flash cells can be programmed sequentially on each layer across each string within each group, from layer 0 at source side to layer 47 at drain side, as shown in FIG. 6C. A subsequent layer may be programmed upon the completion of the current layer, such that the str0 and str1 on layer 1 may be programmed upon the completion of the str0 and str1 on the layer 0, in the left group. Upon completion of programming one group, other groups may be programmed sequentially, such that the right group can be programmed upon completion of the left group. The source-side and drain-side select gates on the strings of str0 and str1 in the left group are turned on, while the source-side and drain-side select gates on the strings of str2 and str3 of the right group in the boosted section 904 are turned off.

In the embodiment of the present invention, with the proposed circuits structure and program schemes, the data in the intensive data reading section 902 can only be programmed to strings following the programming sequence as shown in FIG. 6C. After many times of data read in the strings of str0 and str1 in the intensive data reading section 902, the other strings of str2 and str3 in the boosted section 904 may not suffer read disturbs, since the source-side and drain-side select gates in the boosted section 904 are turned off. The updated data can be programmed to the other strings with high reliability, such as the strings of str2 and str3 in the boosted section 904. The disturbed section 906 may not be used for programming the updated data or new data to prevent errors caused by the read disturb. The whole block may not need to be erased before programming new data, even after severe read disturb to the old data string, such as str0 and str1. In this method, the lifetime of the block would be prolonged.

Since the read disturb only affects the data in the same string or string group, read counts may not need to be recorded in the block level. Instead, the read counts can be recorded by individual string or string group. For each string or string group, the number of read hits thereto can be recorded. If the total number of read hits to the string or sting group is larger than a pre-determined threshold, only the data in that string or string group need to be corrected and relocated to other locations. The data in the other strings or string groups in the same block may be unchanged as their read disturb is negligible. For example, in the embodiment of FIG. 9C, instead of recording read counts for each string, read counts of each string group, such as the left group or the right group, may be recorded, resulting in reduction of the read counts recording. When the number of read hits of the left group is greater than the predetermined threshold, the data in the left group need to be corrected and relocated to other locations. Each string group may have own read counts thereof to be recorded, such that only 2 read counts need to be recorded. The data in the other string groups in the same block may be unchanged as the read disturb thereof is negligible.

It has been discovered that per string or string-group read counts management can record the read counts at string or string-group level, but not at block level. The correction and relocation of the old data can be conducted at the string or string-group level instead of block lever. Therefore, the number of read counts need to be recorded can be reduced, and the data need to be corrected and relocated can be minimized as well, resulting in reduction of read operation cycle time and power consumption.

It has been discovered that circuits and program schemes provided in the embodiments of the present invention can limit read disturb within a string or a group of strings being read. The read disturb may not affect the data stored in the other strings or string groups not being read in the same block. The circuits and program schemes can improve the data reliability due to minimization of the read disturb in NAND flash memory, and reduce the probability of garbage collections in SSD. In particular, it is very useful when programming read intensive data in an open block in some of strings or string groups. New data can be programmed to other strings or string groups in the same block without erasing the whole block in order to guarantee the reliability of the new data, so that the P/E cycle is reduced and lifetime of the NAND block is prolonged. The proposed read counts management may be per string or string group instead of conventional per block.

Figure 10:
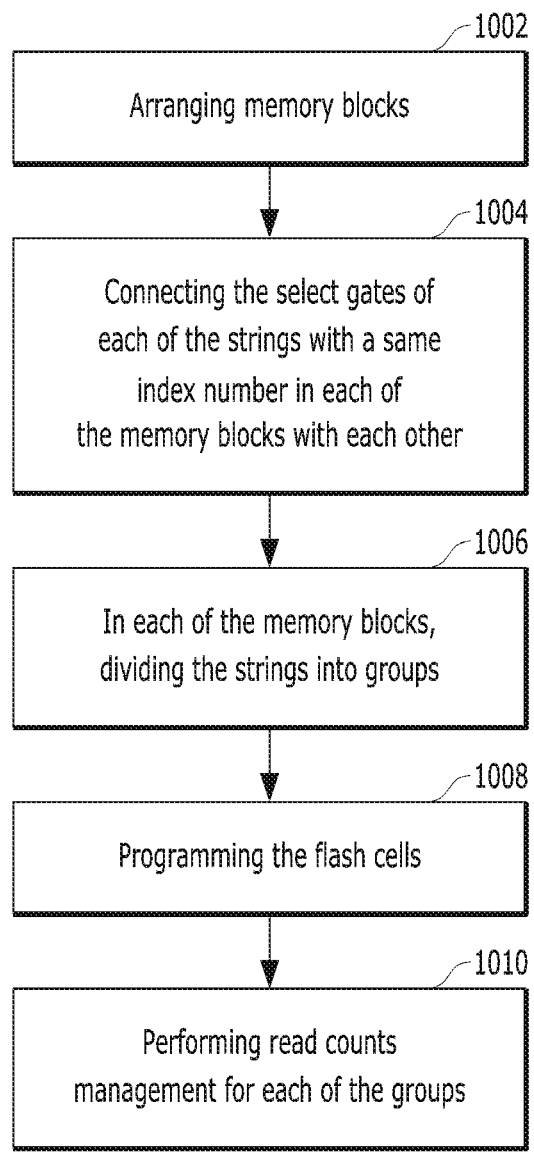
FIG. 10 is a flowchart illustrating an operating method of the memory system in accordance with an embodiment of the present invention.

Referring now to FIG. 10, herein is shown flowchart illustrating an operating method of the memory system in accordance with an embodiment of the present invention. The operation method includes: arranging memory blocks, each of the memory blocks includes strings, each of the stings has flash cells and select gates thereon, in a block of 1002; connecting the select gates of each of the strings with a same index number in each of the memory blocks with each other in a block of 1004; in each of the memory blocks, dividing the strings into groups, each of the groups includes at least one string in a block of 1006; programming the flash cells in a block of 1008; and performing read counts management for each of the groups in a block of 1010.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An apparatus of a memory system comprising:
   memory blocks, each of the memory blocks including strings, each of the stings having flash cells and select gates thereon, wherein
   the select gates of each of the strings with a same index number in each of the memory blocks are connected with each other,
   in each of the memory blocks, the strings are arranged in groups, each of the groups including strings, at least one of the groups in each of the memory blocks including at least one string for a data read operation and at least one other string,
   wherein, in a data read operation on a select one of the at least one of the groups in a select one of the memory blocks, the at least one string for the data read operation is on and the least one other string in the select group is off for boosting; and
   wherein each of the groups has its own read counts management.

2. The apparatus recited in claim 1 wherein the at least one of the groups in each of the memory blocks is a data reading group, the rest of the groups being boosted groups, the at least one data reading group including the at least one of the groups that includes the at least one string that is on for the read operation and the boosted groups, including all strings therein, in the select memory block are off for boosting.

3. The apparatus recited in claim 2 wherein the boosted groups are selected for writing new data.

4. The apparatus recited in claim 1 wherein the flash cells are programmed along each of the strings, a subsequent string is programmed upon completion of programming a previous string.

5. The apparatus recited in claim 1 wherein the select gates include source-side select gates and drain-side select gates.

6. The apparatus recited in claim 5 wherein the flash cells are programmed across each of the strings within one of the groups, from the source-side select gates to the drain-side select gates.

7. The apparatus recited in claim 5 wherein the source-side select gates in each of the groups of each of the memory blocks share a same gate signal and a same source signal.

8. The apparatus recited in claim 1 wherein the read counts management of each of the groups includes recording the read counts of each of the groups.

9. The apparatus recited in claim 1 wherein the read counts management of each of the groups includes relocating data of a group when read counts thereof is greater than a threshold.

10. A method of operating a memory system comprising:
    arranging memory blocks, each of the memory blocks includes strings, each of the stings has flash cells and select gates thereon;
    connecting the select gates of each of the strings with a same index number in each of the memory blocks with each other;
    in each of the memory blocks, arranging the strings into groups, each of the groups including strings, at least one of the groups in each of the memory blocks including at least one string for a data read operation and at least one other string;
    programming the flash cells including performing a data read operation on a select one of the at least one of the groups in a select one of the memory blocks, wherein the at least one string for the data read operation in the select group is on and the at least one other string in the select group is off for boosting; and
    performing read counts management for each of the groups.

11. The method recited in claim 10 wherein the arranging the strings into groups includes forming at least one data reading group, and the rest of the groups as boosted groups, the at least one data reading group including the at least one of the groups that includes the at least one string that is on for the read operation and the boosted groups including all strings therein, in the select memory block are off for boosting.

12. The method recited in claim 11 wherein the boosted groups are selected for writing new data.

13. The method recited in claim 10 wherein the programming the flash cells includes programming the flash cells along each of the strings, programming a subsequent string is upon completion of programming a previous string.

14. The method recited in claim 10 wherein the arranging the memory blocks having select gates includes arranging the memory blocks having source-side select gates and drain-side select gates.

15. The method recited in claim 14 wherein the programming the flash cells includes programming the flash cells across each of the strings within one of the groups, from the source-side select gates to the drain-side select gates.

16. The method recited in claim 14 wherein the arranging the memory blocks having select gates includes arranging the memory blocks having source-side select gates in each of the groups of each of the memory blocks sharing a same gate signal and a same source signal.

17. The method recited in claim 10 wherein the performing read counts management of each of the groups includes recording the read counts of each of the groups.

18. The apparatus recited in claim 10 wherein the performing read counts management of each of the groups includes relocating data of a group when read counts thereof is greater than a threshold.

* * * * *